(12) United States Patent
Zhou et al.

(10) Patent No.: US 6,489,380 B1
(45) Date of Patent: Dec. 3, 2002

(54) LONG AND SHORT-CHAIN CYCLOALIPHATIC EPOXY RESINS WITH CYANATE ESTER

(75) Inventors: Xiao-Qi Zhou, San Diego; Henry Wevick, Rialto; Nancy E. Iwamoto, Ramona; Shao Wei Li; Alan Grieve, both of San Diego, all of CA (US)

(73) Assignee: Johnson Matthey Electronics, Inc., Spokane, WA (US)

( * ) Notice: Subject to any disclaimer, the term of this patent is extended or adjusted under 35 U.S.C. 154(b) by 0 days.

(21) Appl. No.: 09/561,852

(22) Filed: Apr. 27, 2000

Related U.S. Application Data

(63) Continuation of application No. 09/133,507, filed on Aug. 12, 1998, now Pat. No. 6,057,402.

(51) Int. Cl.[7] .......................... C08K 3/08; C08L 63/00; C08L 79/00
(52) U.S. Cl. .............. 523/427; 523/428; 523/434; 525/113; 525/122; 525/524
(58) Field of Search ................. 523/427, 428, 523/434; 525/113, 122, 524

(56) References Cited

U.S. PATENT DOCUMENTS

| | | | | |
|---|---|---|---|---|
| 5,250,848 A | * | 10/1993 | Christie et al. | 525/122 |
| 5,350,815 A | * | 9/1994 | Markovitz et al. | 535/533 |
| 5,571,593 A | * | 11/1996 | Arndt et al. | 428/131 |
| 5,863,970 A | * | 1/1999 | Ghoshal et al. | 523/434 |

OTHER PUBLICATIONS

Chemical abstracts registry No. 25085–98–7 for UVACURE 1500 (1967).*

Chemical abstracts registry No. 106–85–5 for 4–vinylcyclohexene oxide (1967).*

UVACURE products sheet for UVACURE 1500 (1999).*

* cited by examiner

Primary Examiner—Robert E. L. Sellers
(74) Attorney, Agent, or Firm—Rutland, Tucker, LLP; Sandra P. Thompson; Robert D. Fish

(57) ABSTRACT

Compositions having high moisture resistance and flexibility comprise an organic component and a filler. The organic component comprises a long-chain cycloaliphatic epoxy resin, a short-chain cycloaliphatic epoxy resin, a cyanate ester, and a Lewis acid catalyst. Preferably the organic component further comprises a Bronsted acid co-catalyst and/or a flexibilizing modifier. The compositions are useful in various semiconductor applications, including as die attach adhesives, underfills, encapsulants, via fills, prepreg binders, polymer solder masks and polymer bumps on flip chip or BGA assemblies.

29 Claims, No Drawings

LONG AND SHORT-CHAIN CYCLOALIPHATIC EPOXY RESINS WITH CYANATE ESTER

This application is a continuation of application Ser. No. 09/133,507 filed Aug. 12, 1998, U.S. Pat. No. 6,057,402.

BACKGROUND OF THE INVENTION

The present invention relates to a resin composition useful in the formulation of die attach adhesives, encapsulants, underfills, via fills, prepreg binders, polymer solder masks and polymer bumps on flip chip or BGA assemblies.

As uses for semiconductor devices continue to increase, there is a growing demand for adhesive compositions and resin formulations useful in the packaging of such devices both on the board and substrate level. Adhesives are used, for example, to attach dies to semiconductor packages under a variety of conditions. Underfills are used to reduce stress and increase the reliability of solder ball joints found between the substrate, i.e., package, and the die. Encapsulants are used to completely encapsulate, seal and bond a die to a semiconductor package. Via fills are used in both board and laminate substrates to fill the vias in the substrate. Binders found in the manufacture of printed circuit boards and laminate substrates are needed as part of the structural composite of the laminate, serving to bind various metal layers and circuitry together into a single functioning unit. The alternating layers of circuitry, metal planes and vias, along with a matte material, such as glass fibers (which help with structural integrity), are bound together with the organic polymer binder to create the total laminate. Simple layered structures of glass and binder are often sold in a pre-cured state call "prepregs", which are later head-bonded or laminated together as part of the process that creates the laminate substrate or printed circuit board.

To be useful in the manufacture of semiconductor devices, die attach adhesives and the like must meet certain performance, reliability and manufacturability requirements as dictated by the particular application. Performance properties for which there are typically minimum requirements include adhesion, coefficient of thermal expansion, flexibility, temperature stability, moisture resistance and the like. Reliability requirements are typically evaluated by the device's sensitivity to moisture-induced stress. Manufacturability requirements generally include specific requirements for rheology, cure rates and usable pot life and the like. For both the via fill and laminate structures, properties must be met that exhibit superior dimensional stability to processes such as plating, machining, sanding and baking.

Moisture resistant and flexible materials are highly desirable for the manufacture of semiconductor devices. Moisture inside a package turns to steam and expands rapidly when the package is exposed to high temperatures (for instance during solder reflow, infrared or convection baking, or if the package is contacted by molten solder). Under certain conditions, moisture induced pressure will initialize package failure such as internal delamination in the interfaces, internal cracking, wire necking, bond damage. and of course the obvious external crack i.e. popcorning.

Resin compositions comprising a cyanate ester and epoxy resins have been demonstrated to be useful as die attach adhesives, underfills, and the like. While the performance characteristics for such resin compositions are adequate for some applications, there is a continuing need to improve reliability and manufacturing performance of the compositions. Currently available compositions address some, but not all, of the following performance criteria: long pot life, fast cure. and high adhesion. Currently available materials tend to exhibit high rigidity with a Young's modulus of 4–7 GPa at room temperature and low moisture resistance. A need therefore exists for compositions that exhibit adequate flexibility while providing sufficient moisture resistance.

SUMMARY OF THE INVENTION

In one embodiment, the present invention is directed to a composition comprising an organic component and a filler, wherein the organic component comprises at least one longchain cycloaliphatic epoxy resin, at least one short-chain cycloaliphatic epoxy resin, at least one cyanate ester, and at least one Lewis acid catalyst. Preferably the composition further comprises a bronsted acid co-catalyst and/or a flexibilizing modifier.

In another embodiment, the invention is directed to a method for preparing a die attach adhesive comprising preparing a formulation comprising a composition as described above, dispensing the formulation onto a substrate, and curing the formulation.

In still another embodiment, the invention is directed to a method for preparing an underfill comprising preparing a formulation comprising a composition as described above to a rheology suitable for dispensing purposes, dispensing the formulation onto a substrate, and curing the formulation.

In yet another embodiment, the invention is directed to a method for preparing an encapsulant comprising preparing a formulation comprising a composition as described above. dispensing the formulation onto an electrical component, and curing the formulation.

The invention is also directed to a method for preparing a via fill comprising: preparing a formulation comprising a composition as described above, printing the formulation into one or more holes in a substrate, and curing the formulation.

Additionally, the invention is directed to a method for preparing a prepreg binder comprising preparing a formulation comprising a composition as described above, impregnating the formulation into a matte, and B-staging the formulation.

Another aspect of the invention is a method for preparing a polymer solder mask comprising preparing a formulation comprising a composition as described above and at least one catalyst capable of serving as a photoinitiator, applying a film of the formulation onto a substrate to form a formulation-coated substrate, photoimaging the formulation-coated substrate, curing the formulation, and developing the formulation-coated substrate.

Yet another aspect of the invention is a method for preparing polymer bumps on a flip chip or BGA assembly comprising preparing a formulation comprising a composition as described above, printing the formulation onto a substrate to form polymer bumps, B-staging the formulation, contacting the polymer bumps with a bond pad to form an electrical contact, and curing the formulation onto the bond pad.

DETAILED DESCRIPTION OF THE INVENTION

In one embodiment, the present invention is directed to a composition particularly suitable for die attach adhesives, underfills and the like. The composition comprises an organic component and a filler. The organic component comprises a long-chain cycloaliphatic epoxy resin, a short-chain cycloaliphatic epoxy resin, a cyanate ester, and a Lewis acid catalyst.

One or more long-chain cycloaliphatic epoxy resins are included to impart flexibility to the composition. A long-chain cycloaliphatic epoxy resin is one having a long chain containing at least 4 carbon atoms between the cycloaliphatic groups. Preferably the long chain does not contain any cyclic groups. Particularly suitable long-chain cycloaliphatic epoxy resins useful in the present invention include, but are not limited to, bis[3,4-epoxy-cyclo-hexyl-methyl]-adipate (CAS # 3130-19-6) (for example, that sold under the trademark ERL4299 by Union Carbide of Danbury, Conn.), and cycloaliphatic mono- and di-epoxy oligosiloxanes such as epoxidized α,ω-di-(3,4 cyclohexene-2-ethyl)-tetramethyl disiloxane, epoxidized α,ω-di-(3,4 cyclohexene-2-ethyl-hexamethyl trisiloxane, and epoxidized α-3,4-cyclohexene-2-ethyl pentamethyldisiloxane (these resins can be obtained, for example, as described in J. Poly. Sci. Poly. Chem., 28:479–502 (1990), the disclosure of which is incorporated herein by reference). The total amount of long-chain cycloaliphatic epoxy resins in the composition preferably ranges from about 5% to about 20 % by weight, more preferably about 12% to about 15% by weight, still more preferably about 13.4% by weight, based on the total weight of the organic component.

One or more short-chain cycloaliphatic epoxy resins are included in the composition which help to increase temperature resistance and reduce bleeding of the formulation. A short-chain cycloaliphatic epoxy resin is one having a short chain between the cycloaliphatic groups with the short chain containing 3 or less, preferably 2 or less, carbon atoms. Particularly suitable short-chain epoxy resins for use in the present invention include, for example, (CAS # 2386-87-0) (for example, that sold under the trademark ERL4221 by Union Carbide). Other useful short-chain epoxy resins include, but are not limited to, vinyl cyclohexene dioxide (available, for example, from Aldrich, Milwaukee, Wis.), (sold by Union Carbide under the tradename ERL420b), and 2-(3,4-epoxycyclohexyl-5,5-spiro-3,4-epoxy cyclohexane meta-dioxane (sold by Union Carbide under the tradename ERL-4234), and the proprietary cycloaliphatic resin compositions sold under the tradenames UVACURE 1500, UVACURE 1501 UVACURE 1562 and UVACURE 1533 (UCB Chemicals, Smyrna, Ga.). The total amount of short-chain cycloaliphatic epoxy resins in the composition preferably ranges from about 10 to about 35% by weight, more preferably about 25% to about 29% by weight, still more preferably 26.9%, based on the total weight of the organic component.

One or more cyanate esters, in combination with the cycloaliphatic epoxy resin(s), impart both adhesion and moisture resistance to the composition due to the highly aliphatic nature of the epoxy as well as due to the formation of cross-product species such as isocyanurates and oxazolidones. These cyanate esters have one, and preferably two or more, isocyanate (-OCN) functional groups. They can be monomer or oligomers, preferably with a molecular weight ranging from 100 to 2000 depending upon final application. Particularly preferred cyanate esters for use in the present invention include, but are not limited to, 1,1'-bis[4-cyanatophenyl]ethane (for example, that sold under the trademark AroCy L-10 by Ciba Geigy), bis(4-cyanato-3,5-dimethylphenyl)methane (available from Ciba Geigy), and 1,3-bis(cyanatophenyl-1-(1-methylethylethylidene)) benzene (available from Ciba Geigy). The cvanate ester is preferably present in the composition in an amount ranging from about 30 to about 50% by weight, more preferably about 37% to about 43% bv weight, still more preferably about 40.2% by weight, with respect to the total weight of the organic component.

Also included in the composition is a Lewis acid catalyst. It has been found that the use of a Lewis acid catalyst produces improved reactivity and product distribution over other metal catalysts. Preferred lewis acid catalysts for use in the present invention include, but are not limited to, compositions comprising titanium-based compounds, such as titanium (IV) isopropoxide, titanium (IV) butoxide, titanium (IV) ethoxide, chlorotitanuim (IV) triisopropoxide, titanium (IV) propoxide, titanium diisopropoxide bis(2,4-pentanedione), titanium (IV) cresylate, titanium (IV) bis(acetoacetonate)diisopropoxide, titanium (IV) oxide acetylacetonate, titanium 2-ethylhexoxide, oroano-tin compounds such as tributyl(ethyl)tin, tributyl(1-ethoxyvinyl)tin, tributyl(hexylethynevl)tin, trimethylphenyl tin, tetrabutyl tin, and bis-(2-ethylhexanoyloxy)bis-(2ethylhexyl)tin (all available from Aldrich); and zirconium-based compounds such as zirconium (IV) acetylacetonate (available from Aldrich), zirconium (IV) neoalkanolato, tris(neodecanto-O) (such as Ken React NZO1 available from Kenrich Petrochemicals, Bayonne, N.J.), zirconium (IV) neoalkanolato, tris(diisooctyl)pyrophosphato-O (such as Ken-React NZ38), zirconium (IV) bis octanolato cyclo (dioctyl) pyrophosphato-O,O (such as Ken-React KZ OPPR) and zirconium (IV) ethylhexanoate; tantalum-based compounds (such as those available through Gelest, Tullytown, Pa.); borane-amine complexes such as tertbutylamine (available, for example, from Aldrich); boron complexes, such as the proprietary composition sold under the tradename DY9577 (Ciba-Geigy); and vanadium-based catalysts (such as those available through Gelest). In additional, stronger Lewis acids. such as boron halides, amino complexes of boron halides and aluminum halides can be used. Preferably the Lewis acid catalyst comprises a titanium-based compound or a zirconium-based compound. The Lewis acid catalyst is preferably present in the composition in an amount ranging from about 0.4% to about 0.8% by weight, more preferably about 0.5% to about 0.7% by weight, still more preferably about 0.7% by weight, based on the total weight of the organic component.

The filler can be any suitable filler known in the art, such as metal flakes and powders and inorganic powders. Examples of suitable fillers include, but are not limited to, silver, gold, copper, conductive polymers (such as Eeonomer, available through Eeonyx, Pinol, Calif.), boron nitride, aluminum nitride, alumina, silica, silicon nitride. silicon carbide, graphite, and diamond. The filler is preferably present in the composition in an amount ranging from about 50% to about 90% by weight based on the total weight of the composition. Where the filler is an electrically conductive metal filler, such as silver, gold or copper, it is present in the composition in an amount preferably of about 65% to about 90%, more preferably about 70% to about 80%, still more preferably about 80%, by weight. Where the filler is a non-conductive filler, such as silica or alumina, preferably it is present in the composition in an amount of about 50% to about 65%, more preferably about 58% to about 62%, still more preferably about 60%, by weight.

In a preferred embodiment, the organic component of the inventive composition further comprises one or more Bronsted acid co-catalysts, which promote rapid chemical reaction at a relatively low temperature. Preferably the Bronsted acid co-catalyst is a weak Bronsted acid catalyst, i.e., having a pKa greater than or equal to about 4. Particularly preferred Bronsted acid co-catalysts useful in the present invention include, but are not limited to, phenol-based molecules, such as catechol, 4-nitrosophenol, tert-butylphenol, 2,3-dimethoxyphenol, 2,6-dimethyl-4-nitrophenol, bisphenolA, 4-(4-nitrophenylazo)catechol, 4-methylcatechol, ethoxylated nonylphenol acrylate, and nonylphenol; beta diketonates (such as benzoylacetone and dibenzoylmethane), diesters (such as ethyl malonate), and ketoesters (such as ethyl acetoacetate). The Bronsted acid co-catalyst is preferably present in the composition in an amount ranging from about 0.3 to about 0.8% by weight, more preferably about 0.5% by weight, based on the total weight of the organic component of the composition.

In a particularly preferred embodiment, the organic component also comprises one or more flexibilizing modifiers. Preferred flexibilizing modifiers for use in the composition include, but are not limited to, functionalized flexible long-chain compounds, such as epoxy-terminated siloxanes, epoxy/hydroxy functiondized poly butadiene (available, for example, from Aldrich) and epoxidized oils, such as epoxidized methyl linseedate (for example, Vikoflex 9010, sold by Elf Atochem, Philadelphia, Pa.) and long-chain functionalized double-bonded compounds, such as acrylates and rubbers, for example, urethane acrylates (such as those sold under the names CN 953 and CN 980 by Sartomer Co., Exton, Pennsylvania, and Ebecryl 8402 by UCB Chemicals, Smyrna, Ga.) and methacrylated polybutadiene acrylonitrile (such as those sold under the names Echo Resin MBXN 327 by Echo Resins and Lab., Versailles, Mich., and Ebecryl 3604 from UCB Chemicals). As used herein, the terrn "functionalized" refers to compounds that are polymerizable under a catalyst and cure temperature of the present system or compounds that are capable of allowing free radical initiation by peroxides, azo-type initiators or other free radical sources. The flexibilizing modifier is preferably present in the composition in an amount ranging from about 5 to about 25% by weight, more preferably from about 16% to about 20%, still more preferably about 18% by weight, based on the total weight of the organic component.

The present compositions can contain additional components, as known to those skilled in the art. For example. the compositions can contain an anti-chain transfer agent or a free radical initiator.

The compositions of the present invention are particularly useful in the manufacture of semiconductor devices. Specifically, the resin compositions of the present invention are useful in formulating die attach adhesives, underfills, encapsulants, via fills, and binders for a printed circuit board laminant.

Die Attach Adhesives

Die attach adhesives are used to attach semiconductor chips, i.e., to lead frames. Such adhesives must be able to be dispensed in small amounts at high speed and with sufficient volume control to enable the adhesive to be deposited on a substrate in a continuous process for the production of bonded semiconductor assemblies. Rapid curing of the adhesives is very desirable. It is also important that the cured adhesives demonstrate high adhesion, high thermal conductivity, high moisture resistance and temperature stability and good reliability.

Conductive die attach adhesives prepared in accordance with the present invention comprise the resin composition of the present invention, including at least one conductive filler. For thermally conductive adhesives (without electrical conductivity) non-conductive fillers such as silica, boron nitride, diamond, carbon fibers and the like may be used. In addition to the electrically and/or thermally conductive filler, other ingredients such as adhesion promoters, anti-bleed agents, rheology modifiers, and the like may be present.

Typical steps in the preparation of a die attach adhesive include preparing the uncured formulation to a rheology typical for dispense purposes, dispensing the formulation onto a suitable substrate, placing a die on top of the formulation to set a bond-line, and curing the formulation. Suitable substrates include, for example, ceramic, gold-plated ceramic. copper leadframes, silver-plated copper leadframes, laminant substrates, (such as copper-, silver- or gold-plated laminant substrates), and heat slugs (such as copper heat slugs and silver-coated heat slugs).

Encapsulants

Encapsulants are resin compositions that are used to completely enclose or encapsulate an electronic component. An encapsulant prepared in accordance with the present invention comprises the resin composition of the present invention, including non-conductive fillers such as silica, boron nitride, carbon filer and the like. Such encapsulants preferably provide excellent temperature stability, e.g., are able to withstand thermocycling from −65° C. to 150° C. for 1000 cycles; excellent temperature storage stability, e.g., 1000 hours at 150° C.; supply excellent protection against moisture e.g., are able to pass a pressure cooker test at 121° C. at 14.7 psi for 200 to 500 hours with no failures; and are able to pass a HAST (highly accelerated stress test) test at 140° C., 85% humidity at 44.5 psi for 25 hours without any electrical mechanical failures.

Typical steps in the preparation of a liquid encapsulant include preparing a formulation, dispensing (e.g., syringe dispensing) the formulation on the top of the electronic component, and curing the formulation.

Underfills

Underfill materials are used in flip-chip devices to fill the space between the flip chip and substrate. The underfill material environmentally seals the active surface of the flip chip as well as the electrical interconnections. It also provides an additional mechanical bond between the flip chip and the substrate and prevents excessive stress on the small electrical interconnects between the chip and the substrate. The underfill material is typically an epoxy resin with inert fillers. The viscosity is adjusted to provide proper flow characteristics to allow complete filling of the space.

Typical steps for preparing an underfill include preparing the uncured formulation to a rheology typical for dispensing purposes, dispensing the formulation onto the substrate, and curing the formulation. Depending upon the application, the formulation rheology is adjusted depending upon whether the underfill is edge-dispensed for capillary flow or syringe-dispensed for a no-flow underfill process.

Via Fills

Via fills are used to fill the vias in the substrate. The vias form electrical or thermal conductive pathways in the substrate. Filling the vias is necessary to maintain the dimensional stability of the substrate. The via fill material preferably contains a conductive filler that will be either metal or inorganic filled, depending upon the need for electrical and/or thermal conductivity. In addition the filler will act as part of the structural stability of the material against expansion or shrinkage during steps such as plating, baking, machining, drilling, sanding or sawing. Advantageously, the via fill material has good adhesion to both metal and laminate layers as well as good moisture resistance.

Typical steps in preparing a via fill include preparing an un-cured formulation, preferably in the form of a paste of high viscosity adequate for screen or stencil printing, printing the formulation into the holes of a substrate, and curing the formulation.

Prepreg Binders

Prepreg binders are used to create the laminant structure used in printed circuit boards and semiconductor laminate packages. The structure typically consists of alternating layers of metal planes. metal circuit patterns and prepreg. Generally, the prepreg laminant layers comprise a structural material matte (e.g., a glass matte), and the binder is impregnated in the matte. Binder material advantageously has high moisture resistance, has high adhesion to the glass matte and to the subsequent metal layers used, has high Tg, has high strength, and is capable of machining without cracking, peeling or shatter.

Typical steps in the preparation of a prepreg binder include, preparing a formulation as described above, impregnating the formulation into the matte, and B-staging (i.e., partial curing) the formulation. Once the prepreg binder is prepared, circuitry or other structures (vias, ground planes. etc.) are formed on the matte, and one or more matte structures are laminated at high temperature.

Polymer Solder Masks

Another use for the formulations according to the invention is as a moisture-resistant solder mask. Solder masks are photo-imagable materials that are used to define circuitry on packages. Because moisture-resistance is a point of failure for many solder masks, the high moisture-resistance of the polymer is needed.

Typical steps in the preparation of a solder mask include preparing an un-cured formulation comprising one or more catalysts that are capable of serving as photo-initiators (including free radical initiators and metal-based radical cation lewis acid initiators), applying a thin film of the formulation to a substrate (e.g., a laminate substrate) to form a formulation-coated substrate, which may involve web, stencil or screen printing or meniscus or spin coating, photoimaging the formulation-coated substrate, curing the formulation, and developing the formulation-coated substrate.

Polymer Bumps on a Flip Chip Assembly or on a BGA Assembly

Another use of the formulations according to the invention is as a moisture-resistant system for polymer bumps used in a flip-chip assembly or a BGA (balt grid array) assembly. The polymer bumps replace typical solder bumps and must be highly electrically conductive.

Typical steps in the preparation of polymer bumps include preparing a formulation to the application rheology, printing (e.g., stencil-, screen- or jet-printing) the formulation onto a substrate (e.g., a silicon die), B-staging the formulation, contacting the polymer bumps with a bond pad to form an electrical contact, and curing the formulation to the bond pad.

The compositions of the present invention are preferably cured at a cure temperature of at least about 130° C. for about 1 hour. More preferably, the compositions are cured at a cure temperature of about 175° C. for about a half hour. As used herein, a polymer is said to be "cured" when useful mechanical strength and adhesive properties are developed. For example, dicyanate monomers develop useful polymer properties when about 85% or more of the cyanate functional groups have reacted to form triazine rings.

The compositions of the present invention can be prepared by any method known to those skilled in the art. A preferred method for preparing the inventive compositions involves first combining the long-chain cycloaliphatic epoxy resin(s), the short-chain cycloaliphatic epoxy resin(s), and the cyanate ester(s). If included in the composition, the bronsted acid co-catalyst and/or the flexibilizing modifier are also added at this time. These components are all mixed. preferably under vacuum, preferably at a temperature of about 60° C. The components are mixed until a homogenous, transparent mixture is obtained, preferably for about 30 minutes. The mixture is cooled to a temperature ranging from about 10° to about 25° C., more preferably to about 15° C. The Lewis acid catalyst is then added to the mixture. The mixture is set at a temperature of from about 15° C. to about 25° C. more preferably about 15° C., and is mixed, preferably under vacuum for about 30 minutes. The filler is then added to the mixture, which is mixed further, preferably under vacuum for about one hour at 85 r.p.m. and preferably at a temperature of about 25° C. The mixture should then be stored at a temperature ranging from about −40° C. to about −25° C., more preferably about −40° C.

EXAMPLE 1

The following compositions according to the invention were prepared in a manner similar to that described above, with the weight percent of each component indicated, based on the total weight of the composition, and the physical properties provided in Table 1.

| Composition 1 | |
|---|---|
| bis[3,4-epoxy-cyclohexylmethyl]-adipate | 2.7% |
| ERL4299 (Union Carbide, Danbury, Connecticut) | |
| 3,4-epoxy/cyclohexylmethyl-3,4/epoxy cyclonexane carboxylate | 5.4% |
| ERL4221 (Union Carbide, Danbury, Connecticut) | |
| 1,1'-bis[4-cyanatophenyl]ethane | 8.0% |
| AroCy L-10 (Ciba Geigy, Brewster, N.Y.) | |
| catechol | 0.2% |
| titanium 2-ethylhexoxide | 0.1% |
| epoxidized hydroxylated polybutadiene | 3.6% |
| silver filler | 80% |
| PM4130 (Johnson Matthey, San Diego, CA) | |

| Composition 2 | |
|---|---|
| bis[3,4-epoxy-cyclohexylmethyl-adipate] | 7.2% |
| ERL4299 (Union Carbide, Danbury, Connecticut) | |
| 1,1'-bis[4-cyanatophenyl]ethane | 7.2% |
| AroCy L-10 (Ciba Geigy, Brewster, N.Y.) | |
| catechol | 0.09% |
| titanium 2-ethylhexoxide | 0.1% |
| 1,6-dicyanohexane | 0.4% |
| D7800-8 (Aldrich Chemical Co., Milwaukee, WI) | |
| hydantion epoxy resin: 2,4-imidazolidinedione-5-ethyl-5-methyl-1,3-bis(oxiranylmethyl) | 0.61% |
| Araldite AY 238 (Ciba-Geigy Corp., Brewster, NY) | |
| modified acrylated bisphenol A epoxide 99% + | 0.9% |
| Echo Resin AE-371 (Echo Resins & Lab., Versailles, MI) | |
| polyethylene glycol (400) diacrylate | 0.96% |
| SR344 (Sartomer Co., Exton, PA) | |
| aliphatic urethane acrylate | 2.24% |
| CN953 (Sartomer Co., Exton, PA) | |
| mixture of AroCy L-10 (96.7%) and dibenzoyl peroxide | 0.3% |
| (Lucidol-98, Elf Atochem, Philadelphia, PA) (3.3%) | |
| silver filler | 80% |
| PM4130 (Johnson Matthey, San Diego, CA) | |

TABLE 1

Physical Properties

| Typical Properties | Composition 1 | Composition 2 |
|---|---|---|
| Filler (Silver) | 80% | 80 |
| Specific gravity | 4 gm/cc | 4 gm/cc |
| Viscoslty @ 40s$^{-1}$ | 11 Pas | 12 Pas |
| Pot life | >8 hrs | >8 hrs |
| Recommended cure profile | 175° C./30 min or 150° C./1 hr | 175° C./30 min or 150° C./1 hr |
| Electrical Volume Resistivity Ωcm | 0.005 | 0.005 |
| Die shear strength (80 × 80 mil die) | 19 kg on Ag spot Cu PLCC leadframe | 19 kg on Ag spot Cu PLCC leadframe |
| Water absorption (in 100° C. boiling water/2 hrs) | 0.11% | 0.19% |
| Hydrolisable ionic contents (Parr bomp 121° C./16 hrs) | Cl$^-$ = 2 ppm, F$^-$ < 1 ppm K$^+$ = 3 ppm, Na$^+$ < 1 ppm | Cl$^-$ = 2 ppm, F$^-$ < 1 ppm K$^+$ = 3 ppm, Na$^+$ < 1 ppm |
| Glass Transition Temperature (DMA method) | 151 ° C. | 140 ° C. |
| Young's Modulus | 0.97 GPa @ 30° C. 0.072 GPa @ 240° C. | 0.90 GPa @ 30° C. 0.06 Gpa @ 240° C. |
| ROC (600 × 600 mil die on Cu foil) | 0.5 m | 0.7 m |
| Weight loss during cure % | 0.22 @ 20–200° C. 0.47 @ 20–250° C. | 0.31 @ 20–200° C. 0.54 @ 20–250° C. |
| Coefficient of thermal expansion | 52 in/in/° C. | 50 in/in/° C. |
| Voiding | <0.2% before cure <0.5% after cure | <0.2% before cure <0.5% after cure |
| Storage life (@–40° C.) | 6 months | 6 months |

Compositions 1 and 2 were tested, along with several commercially available compositions, as described below in Tables 2 to 7.

TABLE 2

Moisture Resistance after 85/85* precondition on BGA substrate
(Die size: 80 × 80 mil; Substrate: BGA laminate with solder mask on surface)
*85/85 test: Expose unencapsulated specimen in 85% relative humidity and 85° C. for 168 hr. and then pass solder reflow at 220° C. for 1 min.

| Material | Die shear strength before condition (kg) | Die shear strength after condition (kg) | Adhesion retention after condition (%) |
|---|---|---|---|
| JM2500* | 6.2 | 2 | 32.2 |
| JM7100* | 4.2 | 4 | 95.2 |
| JM2801* | 9.1 | 5.1 | 56.0 |
| QM1505† | 8.9 | 9.6 | 107.9 |
| Ablebond 8360‡ | 13.6 | 13.9 | 102.2 |
| Composition 1 | 6.2 | 9.8 | 158.1 |
| Composition 2 | 5.2 | 2.1 | 40.4 |

*Commercially available from Johnson Matthey, San Diego, CA
†Commercially available from Quantum Materials, Inc., San Diego, CA
‡Commercially available from Ablestik, Rancho Dominguez, CA

TABLE 3

Moisture Resistance after 85/85* precondition on PLCC substrate
(Die size: 80 × 80 mil; Substrate: PLCC silver coated copper leadframe)
*85/85 test: Expose unencapsulated specimen in 85% relative humidity and 85° C. for 168 hr. and then pass solder reflow at 220° C. for 1 min.

| Material | Die shear strength before condition (kg) | Die shear strength after condition (kg) | Adhesion retention after condition (%) |
|---|---|---|---|
| JM2500 | 17.5 | 12.4 | 70.9 |
| JM7100 | 2.5 | 4.1 | 164 |
| JM2801 | 7.0 | 3.4 | 48.6 |
| QM1505 | 12.6 | 6.7 | 53.2 |
| Ablebond 8360 | 12.2 | 12.8 | 104.9 |
| Composition 1 | 19.3 | 18.4 | 95.3 |
| Composition 2 | 19.3 | 9.9 | 51.3 |

TABLE 4

Moisture Resistance after HAST precondition on PLCC substrate
(Die size: 80 × 80 mil; Substrate: PLCC silver coated copper leadframe)
*HAST test: Expose unencapsulated specimen in 85% relative humidity and 120° C. for 100 hr. and then pass solder reflow at 220° C. for 1 min.

| Material | Die shear strength before condition (kg) | Die shear strength after condition (kg) | Adhesion retention after condition (%) |
|---|---|---|---|
| JM2500 | 17.8 | 1.7 | 10.5 |
| JM7100 | 2.8 | 4.4 | 157 |
| JM2801 | 7.2 | 4.7 | 65.2 |
| QM1505 | 12.4 | 10.5 | 84.7 |
| Ablebond 8360 | 12.1 | 8.6 | 71.1 |
| Composition 1 | 19.9 | 16.6 | 83.4 |
| Composition 2 | 19.4 | 3.7 | 19.1 |

TABLE 5

Moisture absorption after cure
(Test condition: 2 hours in boiling water)

| Material | Water absorption (%) |
|---|---|
| JM2500 | 0.40 |
| JM7100 | 0.09 |

TABLE 5-continued

Moisture absorption after cure
(Test condition: 2 hours in boiling water)

| Material | Water absorption (%) |
|---|---|
| JM2801 | 0.95 |
| QM1505 | 0.11 |
| Ablebond 8360 | 0.48 |
| Composition 1 | 0.11 |
| Composition 2 | 0.19 |

TABLE 6

Weight loss during curing

| Material | Weight loss (%) (15–200° C.) | Weight loss (%) (15–250° C.) |
|---|---|---|
| JM2500 | 0.039 | 0.123 |
| JM7100 | 0.092 | 0.118 |
| JM2801 | 0.104 | 0.173 |
| QM1505 | 0.524 | 0.815 |
| Ablebond 8360 | 3.883 | 5.022 |
| Composition 1 | 0.218 | 0.473 |
| Composition 2 | 0.314 | 0.539 |

TABLE 7

Radius of Curvature (ROC) Comparison
(Die size: 600 × 600 mil; Substrate: copper foil)

| Material | ROC (m) Curing at 175° C./30 min | ROC (m) Curing at 150° C./60 min |
|---|---|---|
| JM2500 | 1.6 | 1.8 |
| JM7100 | 4.1 | 4.7 |
| JM2801 | 0.33 | 0.38 |
| QM1505 | Delamination | Delamination |
| Ablebond 8360 | 0.39 | 0.41 |
| Composition 1 | 0.47 | 0.66 |
| Composition 2 | 0.68 | 1.2 |

EXAMPLE 2

A third composition according to the invention was prepared using different process steps. The vehicle formulation involves eight parts, six of which are individual formulations. For each formulation, the amounts of each component are indicated as a weight percent based on the total weight of that formulation.

One or more dual functional molecules were used to crosslink the three main functional groups (cyanate ester, epoxy, acrylic/vinyl) present in the formulation. Crosslinking molecules that contain functionality common to each group or that can be polymerized by any of the function groups present include MBXN327 (acrylic), EBC3604 (cross functionalized with acrylic and epoxy), UVA1562 (crossfunctionalized with acrylic and epoxy), V-CAP/RC (cross-functionalized with amines and vinyls), AY238 (cross-functionalized with amines and epoxy), and aliphatic urethane acrylates (cross-functionalized with amines and acrylates).

| Part A - Formulation 1 | |
|---|---|
| dibenzoylmethane | 12.0% |
| zirconium 2,4-pentanedionate | 17.0% |
| AKZ970 (Gelest, Inc., Tullytown, PA) | |
| neopentyl(diallyl)oxy & trineodecanoyl zirconate mixture | 7.0% |
| Ken-react NZ01 (Kenrich Petrochemicals, Inc. Bayonne, NJ) | |
| epoxidized methyl linseedate | 30.0% |
| Vikoflex 9010 (Aldrich Chem. Co., Milwaukee, WI) | |
| cycloaliphatic epoxy resin | 34.0% |
| UVA 1501 (Radcure, Smyrna, Georgia) | |

The components were all mixed together, and the mixture was heated to 100° C. with mixing until all of the components were totally dissolved. The temperature was lowered to 60° C. The composition was mixed under vacuum until no more outgassing was observed. The formulation was then stored at room temperature.

| Part B - Formulation 2 | |
|---|---|
| boron trichloride amino complex | 20.0% |
| Accelerator DY9577 (Ciba-Geigy, Brewster, NY) | |
| ethoxylated nonyl phenol acrylate | 20.0% |
| SR504 (Sartomer Co., Exton, PA) | |
| epoxidized methyl linseedate | 60.0% |
| Vikoflex 9010 (Elf Atochem North America, Philadelphia, PA) | |

The DY9577 was dissolved in the SR504 at 60° C., and the combination was mixed under vacuum until no more outgassing was observed. The Vikoflex 9010 was added at 60° C., and the resulting mixture was mixed under vacuum until no more outgassing was observed. The formulation was then stored at room temperature.

| Part C - Formulation 3 | |
|---|---|
| rubber modified epoxy acrylate blend diluted 20% with tripropylene glycol diacrylate | 50.0% |
| Ebecryl 3604 (Radcure, Smyrna, Georgia) | |
| aliphatic urethane diacrylate diluted 10% with N-vinyl-2-pyrrolidone | 5.0% |
| Ebecryl 4834 (Radcure, Smyrna, Georgia) | |
| cyclohexanedimethanol divinyl ether | 25.0% |
| Rapi-cure CHVE (International Specialty Products, Wayne, NJ) | |
| bis[3,4-epoxy-cyclohexylmethyl-adipate] | 10.0% |
| ERL4299 (Union Carbide, Danbury, Connecticut) | |
| conductive polymer | 10.0% |
| Eeonomer P20-6F (Eeonyx Corp., Pinole, CA) | |

All of the components were mixed together. The resulting slurry was passed four times through a three roll mill, resulting in the product having a fog less than 2 microns and random streaks to 15 microns. The mixture was then heated to 60° C. and mixed under vacuum until no more outgassing was observed. The final viscosity of Formulation 3 was approximately 17,000 cps at 40l/s. The formulation was stored at 0° C.

| Part D - Formulation 4 | |
|---|---|
| aliphatic urethane diacrylate | 60.0% |
| Ebecryl 8402 (Radcure, Smyrna, Georgia) | |
| aliphatic urethane acrylate | 20.0% |

-continued

| Part D - Formulation 4 | |
|---|---|
| CN 980 (Sartomer Co., Exton, PA) | |
| vinylcaprolactom mixture, 2H-azepin-2-one & 1-ethylhexahydro V-Cap/RC (International Specialty Products, Wayne, NJ) | 20.0% |

The components were mixed together, and the mixture was heated to 60° C. until the components were dissolved. The composition was mixed under vacuum until no more outgassing was observed. The formulation was stored at room temperature.

| Part E - Formulation 5 | |
|---|---|
| cyclohexanedimethanol divinyl ether Rapi-cure CHVE (International Specialty Products, Wayne, NJ) | 7.0% |
| vinylcaprolactom mixture, 2H-azepin-2-one & 1-ethylhexahydro V-Cap/RC (International Specialty Products, Wayne, NJ) | 18.0% |
| cycloaliphatic epoxy/acrylate oligomer mixture Uvacure 1562 (Radcure, Smyrna, Georgia) | 50.0% |
| hydantion epoxy resin: 2,4-imidazolidinedione-5-ethyl-5-methyl-1,3-bis(oxiranylmethyl) Araldite AY 238 (Ciba-Geigy Corp., Brewster, NY) | 19% |
| pentaacrylate ester SR9011 (Sartomer Co., Exton, PA) | 6.0% |

The components were mixed together and heated to 60° C. The composition was mixed under vacuum until no more outgassing was observed. The formulation was stored at room temperature.

| Part F - Formulation 6 | |
|---|---|
| 1,1-bis[4-cyanatophenyl]ethane AroCy L-10 (Ciba Geigy, Brewster, N.Y.) | 54.5% |
| methacrylated polybutadiene acrylonitrile Echo Resin MB x N327 (Echo Resin, Versailles, MI) | 17.0% |
| cyclohexanedimethanol divinyl ether Rapi-cure CHVE (International Specialty Products, Wayne, NJ) | 28.0% |
| nadic methyl anhydride, methylene 4-endomethylene-tetrahydrophthalic anhydride Hardener HY 906 (Ciba-Geigy Corp., Brewster, NY) | 0.5% |

The AroCy L-10 and MBXN327 were mixed together. The combination was heated to 60° C. and mixed under vacuum until the components were dissolved. The temperature was lowered to 25° C. The HY 906 and CHVE were added. The composition was mixed under vacuum at 25° C. until no more outgassing was observed. The formulation was stored at 0° C.

Part G - Formulation 7
The above formulations were combined to form formulation 7 as follows.

| Formulation 1 | 12.0% |
|---|---|
| Formulation 2 | 2.0% |
| Formulation 3 | 7.0% |
| Formulation 4 | 25.8% |
| Formulation 5 | 17.0% |
| Formulation 6 | 35.0% |
| HY 906 | 0.7% |
| Vinyltrimethoxysilane | 0.5% |

Formulations 3, 4, 5, and 6 were mixed together. The resulting mixture was heated to 40° C. and mixed under vacuum until no more outgassing was observed. The mixture was then cooled to 15° C. Formulation 2 was then added, followed 10 minutes of mixing. Formulation 1 was then added. followed by another 10 minutes of mixing. HY 906 was added, followed by an additional 10 minutes of mixing. The temperature of the mixture was raised to 25° C. Vinyltrimethoxysilane was added, followed by 30 minutes of mixing under vacuum. The resulting composition was stored at 0° C. for one week.

Part H - Complete Formulation
The final die attach formulation comprised two parts: the formulated vehicle (Formulation 7) and filler.

| Formulation 7 | 19.5% |
|---|---|
| Silver filler | 80.5% |

The temperature was set at 15° C. The silver filler and Formulation 7 were mixed together for about 15 minutes under vacuum. The temperature was raised to 25° C., followed by 45 minutes of mixing under vacuum. The composition was transferred to a cartridge with a ram press, and the cartridge was vacuumed for about 20 minutes. The final formulation was put into syringes and stored at −40° C.

The physical properties of composition 3 were tested, as listed in Table 8.

| Filler (silver) | 80.5% |
|---|---|
| Viscosity | 7.1 Pas |
| Pot life | 24 hrs. |
| Recommended cure profile | 175° C./30 min or 150° C./1hr |
| Electrical volume resistivity | 0.0007 ohm-cm |
| Die Shear Strength (80 × 80 mil die) | 15 kg on Ag spot Cu PLCC leadframe |
| Die Shear Strength (200 × 200 mil die) | 60 kg on Ag spot Cu PLCC leadframe |
| Water absorption (in 100° C. boiling water for 2 hrs) | 0.6% |
| Glass Transition Temperature (DMA method) | 142C |
| Young's Modulus | 2.5 Gpa |
| ROC (600 × 600 mil die on Cu foil) | 0.8m |
| Coefficient of thermal expansion | 44-m (T < Tg) 136 ppm (T > Tg) |
| Storage life (at −40° C.) | 6 months |

It is apparent from the foregoing that various changes and modifications may be made without departing from the invention. Accordingly, the scope of the invention is limited only by the appended claims, wherein.

What is claimed is:

1. A composition comprising an organic component and a filler, wherein the organic component comprises:
   at least one long-chain cycloaliphatic epoxy resin,
   at least one short-chain cycloaliphatic epoxy resin,
   at least one cyanate ester, and
   at least one Lewis acid catalyst.

2. A composition according to claim 1, wherein said at least one long-chain cycloaliphatic epoxy resin is selected from the group consisting of cycloaliphatic mono- and di-epoxy oligosiloxanes.

3. A composition according to claim 1, wherein said at least one long-chain cycloaliphatic epoxy resin is selected from the group consisting of bis[3,4-epoxy-cyclo-hexyl-methyl-adipate, epoxidized α,ω-di-(3,4 cyclohexene-2-ethyl)-tetramethyl disiloxane, epoxidized α,ω-di-(3,4- cyclohexene-2-ethyl-hexamethyl trisiloxane, and epoxidized α-3,4-cyclohexene-2-ethyl pentamethyldisiloxane.

4. A composition according to claim 1, wherein said at least one long-chain cycloaliphatic epoxy resin is present the composition in an amount ranging from about 5% to about 20 % by weight based on the total weight of the organic component.

5. A composition according to claim 1, wherein said at least one long-chain cycloaliphatic epoxy resin is present the composition in an amount ranging from about 12% to about 15% by weight based on the total weight of the organic component.

6. A composition according to claim 1, wherein said at least one short-chain cycloaliphatic epoxy resin has a short chain between the cycloaliphatic groups containing 2 or less carbon atoms.

7. A composition according to claim 1, wherein said at least one short-chain cycloaliphatic epoxy resin is selected from the group consisting of 3,4-epoxy-cyclo-hexyl-methyl-3,4-carboxylate, vinyl cyclohexene dioxide, vinyl cyclohexene monoxide, and 2-(3,4-epoxycyclohexyl-5,5-spiro-3,4-epoxy cyclohexane meta-dioxane.

8. A composition according to claim 1 wherein said at least one short-chain cycloaliphatic epoxy resin is present in the composition in an amount ranging from about 10% to about 35% by weight based on the total weight of the organic component.

9. A composition according to claim 1, wherein said at least one short-chain cycloaliphatic epoxy resin is present in the composition in an amount ranging from about 25% to about 29% by weight based on the total weight of the organic component.

10. A composition according to claim 1, wherein said at least one cyanate ester has two or more isocyanate functional groups.

11. A composition according to claim 1, wherein said at least one cyanate ester is selected from the group consisting of 1,1'-bis[4-cyanatophenyl]ethane, bis(4-cyanato-3,5-dimethylphenyl)methane, and 1,3-bis(cyanatophenyl-1-(1-methylethylethylidene))benzene.

12. A composition according to claim 1, where said at least one cyanate ester is present in the composition in an amount ranging from about 30% to about 50% by weight based on the total weight of the organic component.

13. A composition according to claim 1, where said at least one cyanate ester is present in the composition in an amount ranging from about 37% to about 43% by weight based on the total weight of the organic component.

14. A composition according to claim 1, wherein the Lewis acid catalyst comprises a compound selected from the group consisting of titanium-based compounds, organo-tin compounds, zirconium-based compounds, tantalum-based compounds, vanadium-based compounds, borane-amine complexes, boron complexes, boron halides, amine complexes of boron halides, and aluminum halides.

15. A composition according to claim 1, wherein the Lewis acid catalyst comprises a compound selected from the group consisting of titanium-based compounds and zirconium-based compounds.

16. A composition according to claim 1, wherein the Lewis acid catalyst comprises at least one compound selected from the group consisting of titanium (IV) isopropoxide, titanium (IV) butoxide, titanium (IV) ethoxide, titanium chloride, triisopropoxide, titanium (IV) propoxide, titanium diisopropoxide bis(2,4-pentanedione), titanium (IV) bis (acetoacetonate)diisopropoxide. titanium (IV) oxide acetylacetonate, titanium 2-ethylhexoxide, tributyl(ethyl)tin, tributyl(1-ethoxyvinyl)tin, tributyl (phenylethynyl)tin, trimethylphenyltin, tetrabutyl tin, bis-(2-ethylhexanoyloxy)bis-(2ethylhexyl)tin, zirconium (IV) acetylacetonate, zirconium (IV) neoalkanolato, tris (neodecanto-O), zirconium (IV) neoalkanolato, tris (diisooctyl)pyrophosphato-O, zirconium (IV) bis octanolato cyclo (dioctyl) pyrophosphato-O,O, zirconium (IV) ethylhexanoate, and zirconium 2,4-pentanedionate.

17. A composition according to claim 1, wherein said at least one Lewis acid catalyst is present in the composition in an amount ranging from about 0.4% to about 0.8% by weight based on the total weight of the organic component.

18. A composition according to claim 1, wherein said at least one Lewis acid catalyst is present in the composition in an amount ranging from about 0.5% to about 0.7% by weight based on the total weight of the organic component.

19. A composition according to claim 1, wherein the filler contains at least one composition selected from the group consisting of silver, gold, copper, conductive polymers, boron nitride, aluminum nitride, alumina, silica, silicon nitride, silicon carbide, graphite, and diamond.

20. A composition according to claim 1, wherein the filler is present in the composition in an amount ranging from about 50% to about 90% by weight based on the total weight of the composition.

21. A composition according to claim 1, wherein the filler is an electrically conductive metal filler and is present in the composition in an amount ranging from about 70% to about 80% by weight based on the total weight of the composition.

22. A composition according to claim 1, wherein the filler is a non-conductive filler and is present in the composition in an amount ranging from about 50% to about 65% by weight based on the total weight of the composition.

23. A composition according to claim 1, further comprising at least one Bronsted acid co-catalyst.

24. A composition according to claim 23, wherein said at least one Bronsted acid co-catalyst is a weak bronsted acid catalyst.

25. A composition according to claim 23, wherein said at least one Bronsted acid co-catalyst is selected from the group consisting of phenol-based molecules, diketonates, diesters, and ketoesters.

26. A composition according to claim 23, wherein said at least one Bronsted acid co-catalyst is selected from the group consisting of catechol, dibenzoylmethane, 4-nitrosophenol, tert-butylphenol, 2,3-dimethoxyphenol, 2,6-dimethyl-4-nitrophenol, bisphenolA, 4-(4-nitrophenylazo)catechol, 4-methylcatechol, ethoxylated nonylphenol acrylate, nonylphenol, benzoylacetone, dibenzoylmethane, ethyl malonate, and ethyl acetoacetate.

27. A composition according to claim 23, wherein said at least one Bronsted acid co-catalyst is present in the composition in an amount ranging from about 0.3% to about 0.8% by weight based on the total weight of the organic component.

28. A composition according to claim 1 comprising:
at least one long-chain cycloaliphatic epoxy resin present in an amount ranging from about 12% to about 15% by weight based on the total weight of the organic component,
at least one short-chain cycloaliphatic epoxy resin present in an amount ranging from about 25% to about 29% by weight based on the total weight of the organic component,
at least one cyanate ester present in an amount ranging from about 37% to about 43% by weight based on the total weight of the organic component, and at least one Lewis acid catalyst present in an amount ranging from about 0.4% to about 0.8% based on the total weight of the organic component.

29. A composition according to claim 1, comprising bis[3,4-epoxy-cyclohexylmethyi-adipate, 3,4-epoxy-cyclohexylmethyl-3,4-carboxylate, 1,1'-bis[4-cyanatopnehyl]ethane, catechol, titanium 2-ethylhexyloxide, and epoxidized polybutadiene.

* * * * *

UNITED STATES PATENT AND TRADEMARK OFFICE
CERTIFICATE OF CORRECTION

PATENT NO. : 6,489,380 B1
DATED : April 27, 2000
INVENTOR(S) : Xiao-Qi Zhou et al.

It is certified that error appears in the above-identified patent and that said Letters Patent is hereby corrected as shown below:

<u>Title page,</u>
Item [74], *Attorney, Agent, or Firm*, replace "Rutland, Tucker, LLP" with
-- Rutan & Tucker, LLP --.

Signed and Sealed this

Twenty-second Day of July, 2003

JAMES E. ROGAN
*Director of the United States Patent and Trademark Office*